(12) United States Patent
Lee et al.

(10) Patent No.: US 10,325,633 B2
(45) Date of Patent: Jun. 18, 2019

(54) STORAGE DEVICE AND DATA TRAINING METHOD THEREOF

(71) Applicant: Samsung Electronics Co., Ltd., Suwon-si, Gyeonggi-do (KR)

(72) Inventors: Chulseung Lee, Seoul (KR); ChoongEui Lee, Suwon-si (KR); Soon Suk Hwang, Ansan-si (KR); Kyuwook Han, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/962,206

(22) Filed: Apr. 25, 2018

(65) Prior Publication Data

US 2019/0080730 A1    Mar. 14, 2019

(30) Foreign Application Priority Data

Sep. 8, 2017    (KR) .................. 10-2017-0115338

(51) Int. Cl.
| | | |
|---|---|---|
| *G11C 11/10* | (2006.01) | |
| *G11C 7/10* | (2006.01) | |
| *G11C 7/22* | (2006.01) | |
| *G11C 29/02* | (2006.01) | |
| *G06F 13/16* | (2006.01) | |
| *G11C 8/18* | (2006.01) | |

(52) U.S. Cl.
CPC ........ *G11C 7/1006* (2013.01); *G06F 13/1668* (2013.01); *G11C 7/22* (2013.01); *G11C 8/18* (2013.01); *G11C 29/023* (2013.01); *G11C 2207/2254* (2013.01)

(58) Field of Classification Search
CPC ........... G11C 7/1006; G11C 7/22; G11C 8/18; G11C 29/023; G11C 2207/2254; G06F 13/1668
USPC .................... 365/191, 193, 194, 185.02
See application file for complete search history.

(56) References Cited

U.S. PATENT DOCUMENTS

| | | |
|---|---|---|
| 7,443,741 B2 | 10/2008 | Butt et al. |
| 8,037,375 B2 | 10/2011 | Schaefer |
| 8,437,216 B2 | 5/2013 | Oh et al. |
| 8,578,086 B2 | 11/2013 | Chaudhuri et al. |
| 8,760,946 B2 | 6/2014 | Dearth et al. |
| 8,918,686 B2 | 12/2014 | Lai et al. |
| 9,558,850 B1 | 1/2017 | Bialas, Jr. et al. |
| 2009/0168563 A1 | 7/2009 | Jiang |

(Continued)

*Primary Examiner* — Tan T. Nguyen
(74) *Attorney, Agent, or Firm* — Harness, Dickey & Pierce, P.L.C.

(57) ABSTRACT

Disclosed is a storage device. The storage device includes a nonvolatile memory device that receives write data based on a data strobe signal and a data signal and outputs read data based on the data strobe signal and the data signal, and a controller that performs a training operation for training the nonvolatile memory device to align the data signal and the data strobe signal. The controller detects a left edge of a window of the data signal for the training operation. The controller determines a center of the window by using the detected left edge and unit interval length information of the data signal or determines a start point of a detection operation for detecting a right edge of the window by using the detected left edge and the unit interval length information.

20 Claims, 14 Drawing Sheets

(56) References Cited

U.S. PATENT DOCUMENTS

2009/0244997 A1\* 10/2009 Searles ................ G11C 7/1051
365/194
2014/0098621 A1 4/2014 Oh et al.
2015/0278151 A1 10/2015 Tang \* cited by examiner

STORAGE DEVICE AND DATA TRAINING METHOD THEREOF

CROSS-REFERENCE TO RELATED APPLICATIONS

This application claims priority under 35 U.S.C. § 119 to Korean Patent Application No. 10-2017-0115338 filed on Sep. 8, 2017, in the Korean Intellectual Property Office, the entire contents of which are hereby incorporated by reference.

BACKGROUND

Some example embodiments of the inventive concepts disclosed herein relate to semiconductor devices, and more particularly, to storage devices for performing data training at high speed and/or data training methods thereof.

Data training (or DQ training) is desired to secure reliability of data in a storage device implemented with a plurality of nonvolatile memory devices and a controller. The data training includes read training and write training. The read training refers to an operation in which the controller aligns the center of an eye pattern of data Dout output from a nonvolatile memory device. The write training refers to an operation for aligning an eye pattern of data Din to be written in a nonvolatile memory device.

For the data training, the controller may write data of a specific pattern in respective nonvolatile memory devices or may read data of a specific pattern from a nonvolatile memory device. Because a command and an address for the purpose of writing or reading pattern data in a nonvolatile memory device needs to be inputted, a time to input a command and an address and to input or output pattern data and a time for AC timing are inevitably taken to perform the data training.

According to needs for a high-speed and high-capacity storage device, a storage device is desired to include more nonvolatile memory devices as a storage medium and provide a speedier response characteristic. In the storage device including the large number of nonvolatile memory devices, it is desired to reduce open timing for the purpose of providing speedy access performance in a situation such as power-up. Thus, a technology for reducing the open timing, (e.g., a time taken for the data training) is desired.

SUMMARY

Some example embodiments of the inventive concepts provide storage devices in which high-speed data training is possible and/or a data training methods thereof.

According to an aspect of an embodiment, a storage device includes a nonvolatile memory device configured to receive write data based on a data strobe signal and a data signal, and output read data based on the data strobe signal and the data signal, and a controller configured to perform a training operation for training the nonvolatile memory device to align the data signal and the data strobe signal, the controller further configured to detect a left edge of a window of the data signal for the training operation, the controller further configured to determine a center of the window by using the left edge and unit interval length information of the data signal or determine a start point of a detection operation for detecting a right edge of the window by using the detected left edge and the unit interval length information.

According to another aspect of an embodiment, a data training method for a storage device including a controller and a nonvolatile memory device may include performing, by the controller, at least one first edge detection operation to detect a left edge of a window of a data signal, determining, by the controller, a skip interval based on a length of a unit interval of the data signal provided from a delay locked loop circuit of the controller, performing, by the controller, at least one second edge detection operation to detect a right edge of the window, at a point shifted from the left edge by a length of the skip interval, and determining, by the controller, a center of the window by using temporal information of the detected left and right edges to align the data signal.

According to another aspect of an embodiment, a data training method for a storage including a controller and a nonvolatile memory device may include performing, by the controller, a detection operation at least once to detect a left edge of a window of a data signal, reading, by the controller, a unit interval length of the data signal from a delay locked loop circuit of the controller, and combining, by the controller, a location of the detected left edge and the unit interval length to determine a center of the window of the data signal and align the data signal thereto.

BRIEF DESCRIPTION OF THE DRAWINGS

The above and other features and advantages of the present inventive concepts will become apparent from the following description with reference to the following figures, wherein like reference numerals refer to like parts throughout the various figures unless otherwise specified, and wherein.

DETAILED DESCRIPTION

Figure 1:
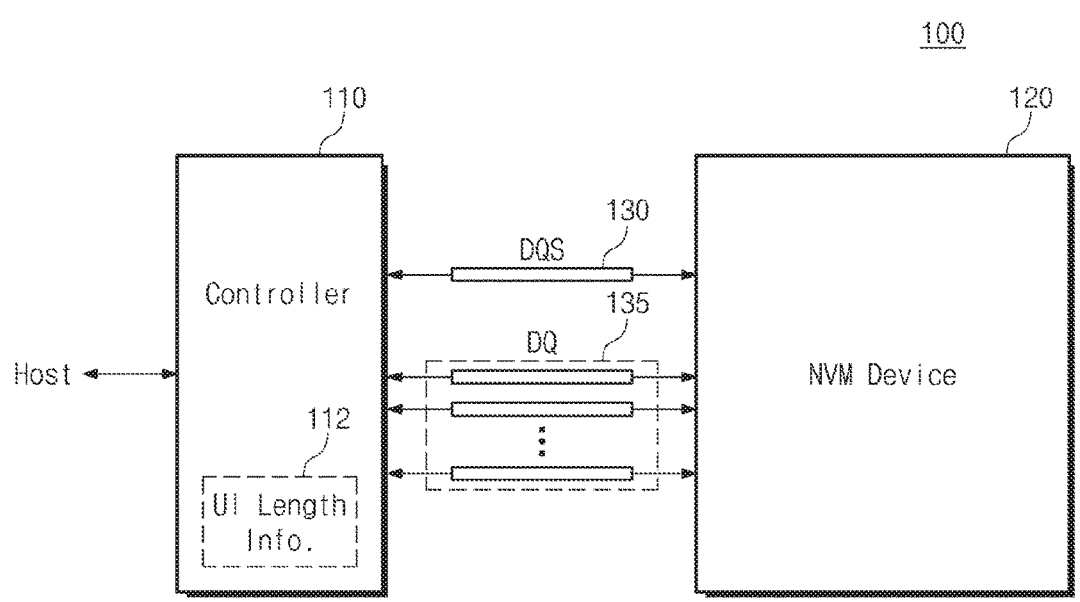
FIG. 1 is a block diagram illustrating a storage device according to an example embodiment of the inventive concepts.

It is to be understood that both the foregoing general description and the following detailed description are provided as examples, for illustration and not for limiting the scope of the inventive concepts. Reference numerals will be represented in detail in the disclosed example embodiments of the inventive concepts, examples of which are illustrated in the accompanying drawings. Wherever possible, the same reference numerals are used in the drawings and the description to refer to the same or similar parts.

Below, a NAND-type flash memory device will be used as an example nonvolatile memory device for describing features and functions of the inventive concepts. One skilled in the art may easily understand other merits and performance of the inventive concepts depending on the contents disclosed here. For example, the features of the inventive concepts may be applied to other nonvolatile memory devices, such as a phase-change RAM (PRAM), a magnetoresistive RAM (MRAM), a resistive RAM (ReRAM), a ferroelectric RAM (FRAM), a NOR flash memory. Here, the term "data training" used in this specification means an operation of searching for and adjusting a center of an eye pattern of a data signal DQ. The term "left edge" means a closed portion of a left side (or first in time) of a unit interval UI of an eye pattern of the data signal DQ. The term "right edge" means a closed portion of a right side (or later in time) of the unit interval UI of the data signal DQ. Further, the expression "unit interval UI" may be used interchangeably with the term "window of a data signal".

The inventive concepts may be implemented or applied through other example embodiments. Further, the detailed description may be changed or modified according to view points and applications without departing from the claims, the scope and spirit, and any other purposes of the inventive concepts Below, some example embodiments of the inventive concepts will be described in detail with reference to the accompanying drawings.

FIG. 1 is a block diagram illustrating a storage device according to an example embodiment of the inventive concepts. Referring to FIG. 1, a storage device 100 includes a controller 110 and a nonvolatile memory device 120. Signal lines 130 and 135 for exchanging data and signals, respectively, are provided between the controller 110 and the nonvolatile memory device 120.

The controller 110 may be configured to control the nonvolatile memory device 120. For example, the controller 110 may write data into the nonvolatile memory device 120 according to a request from outside or a host. Further, the controller 110 may read data stored in the nonvolatile memory device 120 according to a request from outside or the host. The controller 110 may provide the nonvolatile memory device 120 with a command, an address, and/or a control signal to access the nonvolatile memory device 120. The storage controller 110 may access the nonvolatile memory device 120 to read data in response to a request from the host. The controller 110 may exchange a data strobe signal DQS with the nonvolatile memory device 120 via the signal line 130. The controller 110 may exchange the data signal DQ with the nonvolatile memory device 120 via the signal lines 135.

The controller 110 may perform data training (or alternatively referred to as "DQ training") of the nonvolatile memory device 120 in a specific situation of the storage device 100 (e.g., booting and/or initialization). The controller 110 may improve reliability of data exchange with the nonvolatile memory device 120 through the data training. For example, the controller 110 may write or read a training pattern in the nonvolatile memory device 120 under various conditions to detect the window center of the data signal DQ. To align the detected window center of the data signal DQ, the controller 110 may adjust an offset value of a delay locked loop (DLL) or a phase locked loop (PLL).

For example, in data training, the controller 110 of the inventive concepts may reduce or minimize the number of times that an access to the nonvolatile memory device 120 is made. For write training, the controller 110 may provide a training pattern to the nonvolatile memory device 120 and may read the written training pattern therefrom. For read training, the controller 110 may read a training pattern stored in the nonvolatile memory device 120. The controller 110 may compare the read data with a reference pattern and determine a center location of an eye pattern (or a window) depending on the comparison result. Operations of accessing the nonvolatile memory device 120 for data training and comparing the access result (e.g., comparing a read pattern and a reference pattern) may be collectively referred to as a detection step, which is a minimum unit of the data training.

For example, numerous detection steps may be executed during at least one unit interval UI for the data training. For example, in the case where a length of the unit interval UI is 1000 ps and a time desired for one detection step is 10 ps, the detection step may be performed at least 100 times to detect at least one unit interval 1 UI or the window center of the data signal. If the data training scheme is applied to the storage device 100, the open timing of the storage device 100 may inevitably lengthen in a situation where the large number of nonvolatile memory devices are trained.

The controller 110 may reduce the number of detection steps for detecting the center or an edge of the data signal DQ by using unit interval length information 112. For example, after detecting a left edge LE of the data signal, the controller 110 may skip detection steps until the vicinity of a point estimated as a right edge RE of a data signal is located. To this end, the controller 110 may determine the number of detection steps to be skipped with reference to the unit interval length information 112. Afterwards, the controller 110 may execute a detection step in the vicinity of the right edge RE. Here, the unit interval length information 112 may be provided from, for example, a delay locked loop (DLL) circuit.

The large number of detection steps may be skipped through the data training manner of the inventive concepts. Accordingly, a time desired for data training upon booting the storage device 100 including the large number of nonvolatile memory devices may be substantially reduced, and thus the storage device 100 of the inventive concept may be relatively quickly accessed.

The nonvolatile memory device 120 may store data under control of the controller 110. The nonvolatile memory device 120 may transmit data stored therein to the controller 110 under control of the controller 110. In a write operation, the nonvolatile memory device 120 may receive the data signal DQ depending on the data strobe signal DQS provided from the controller 110. In a read operation, the nonvolatile memory device 120 may output the data strobe signal DQS and the data signal DQ to the controller 110 in response to a read enable signal /RE.

The signal lines 130 and 135 may include the signal line 130 for exchanging the data strobe signal DQS and the signal lines 135 for exchanging the data signal DQ. The signal line 130 may electrically connect a data strobe signal (DQS) pin of the nonvolatile memory device 120 with the controller 110. The signal line 135 may electrically connect data input/output pins DQn (n being a natural number) of the nonvolatile memory device 120 with the controller 110. There is a need to align the data signal DQ in the write operation or the read operation according to electrical characteristics of the signal lines 130 and 135. An operation for detecting the center of the data signal DQ and adjusting a sampling point, which is performed in the controller 110, refers to data training.

The storage device 100 capable of reducing a time taken to determine the center of a window or an eye pattern of the data signal DQ in a data training (or DQ training) operation has been briefly described above. The controller 110 of the inventive concepts may reduce the number of detection steps for detecting an edge of the edge pattern by using the unit interval length information 112 of the data signal DQ. Accordingly, a time desired for data training upon booting the storage device 100 may be substantially reduced.

Figure 2:
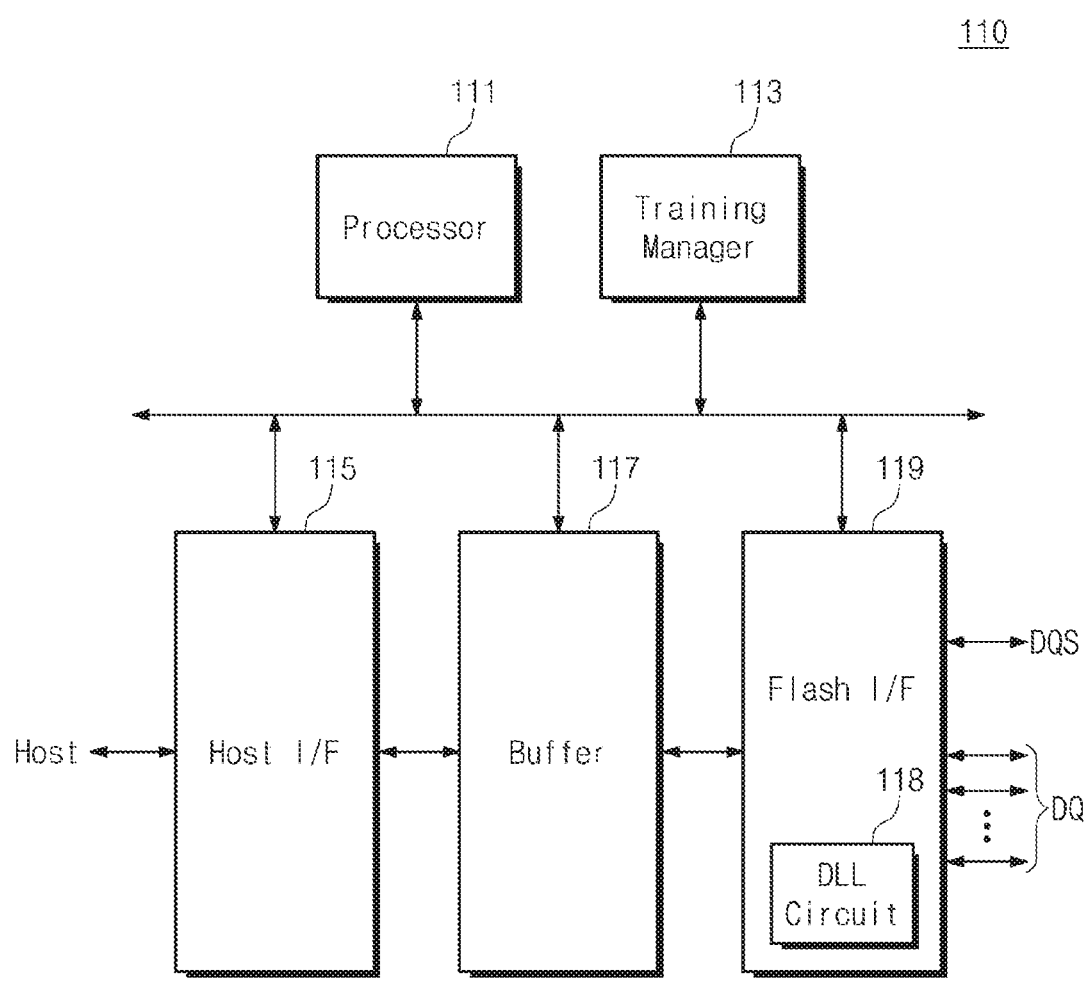
FIG. 2 is a block diagram illustrating a controller according to an example embodiment of the inventive concepts.

FIG. 2 is a block diagram illustrating a controller according to an example embodiment of the inventive concepts. Referring to FIG. 2, the controller 110 includes a processor 111, a training manager 113, a host interface 115, a buffer 117, and a flash interface 119. However, it may be well understood that components of the controller 110 are not limited to the aforementioned components. For example, the controller 110 may further include, for example, a read only memory (ROM) storing code data used for an initial booting operation, or a working memory.

The processor 111 may include a central processing unit or a micro-processor. The processor 111 may process overall control operations that are performed in the controller 110. The processor 111 may be configured to execute firmware or software for operating the controller 110.

The training manager 113 may perform data training (or DQ training) for communication with the nonvolatile memory device 120 in a specific situation (e.g., booting) of the storage device 100 In read training or write training, the training manager 113 may access the nonvolatile memory device 120 to detect at least one of the edges LE and RE of the window of the data signal DQ. To detect the edges LE and RE of the data signal (DQ) window, the training manager 113 may access the nonvolatile memory device 120 and may execute a detection step for determining whether an edge(s) is detected, by using the access result. The training manager 113 executes a plurality of detection steps to determine the center of the data signal (DQ) window. To align the center of the data signal determined, the training manager 113 may adjust an offset value of a delay locked loop (DLL) or a phase locked loop (PLL).

For example, to reduce or minimize the number of detection steps to be applied upon detecting the edges LE and RE of the data signal DQ, the training manager 113 may read unit interval length information from a delay locked loop circuit 118. If the left edge LE of the data signal DQ is detected, the training manager 113 skips the detection step to a point estimated as the right edge RE is located or to the vicinity of the estimated point. In this case, the magnitude of a skip interval SI corresponding to the number of skipped detection steps may be determined by using the unit interval length information. Accordingly, the number of detection steps needed to detect the right edge RE may be reduced or minimized. The training manager 113 may determine the center of the data signal DQ by using the detected edges LE and RE.

In another example embodiment, if the left edge LE of the data signal DQ is detected, the training manager 113 may determine the center of the data signal DQ without detecting the right edge RE. For example, the training manager 113 may determine the center of the data signal DQ by adding one half 0.5 UI of the unit interval length UI to the detected left edge LE. The above example embodiments will be described in detail with reference to the accompanying drawings.

The training manager 113 may set a delay locked loop DLL or a phase locked loop PLL included in the flash interface 119 with an appropriate or optimum timing offset value with reference to the center of the data signal DQ determined. The training manager 113 may be implemented with hardware, but it may be well understood that the training manager 113 is provided in the form of firmware loaded on the working memory.

The host interface 115 may provide an interface between the host and the controller 110. The host and the controller 110 may be connected through at least one of various standardized interfaces. As another example, the host and the controller 110 may be connected through at least one of various standardized interfaces. Here, the standardized interfaces may include various interfaces manners such as advanced technology attachment (ATA), serial ATA (SATA), external SATA (e-SATA), mini SATA (mSATA), a small computer small interface (SCSI), a serial attached SCSI (SAS), peripheral component interconnection (PCI), PCI Express (PCI-E), universal serial bus (USB), IEEE 1394, universal flash store (UFS), and a card interface.

The buffer 117 may temporarily store data exchanged through the host interface 115 and the flash interface 119. Further, the buffer 117 may store a training pattern transmitted from the nonvolatile memory device 120 in a read training operation or a write training operation.

The flash interface 119 may provide an interface between the controller 110 and the nonvolatile memory device 120. For example, data processed by the processor 111 may be transferred to the nonvolatile memory device 120 through the flash interface 119. As another example, data stored in the nonvolatile memory device 120 may be read through the flash interface 119.

The flash interface 119 may include a clock circuit for exchanging the data signal DQ with the nonvolatile memory device 120. For example, the flash interface 119 may include the delay locked loop circuit 118. The center of the window of the data signal (DQ) transmitted from the nonvolatile memory device 120 may be aligned by adjusting a timing offset of the delay locked loop circuit 118. In a data training operation, the delay locked loop circuit 118 may provide the training manager 113 with unit interval length information corresponding to each data line. The unit interval length information provided from the delay locked loop circuit 118 may provide all unit interval length information of data signals provided to a plurality of channels. Further, the delay locked loop circuit 118 may provide unit interval length information having relatively high reliability, which is set according to a process, a voltage, and a temperature of the storage device 100.

Example components of the controller 110 are explained above. The controller 110 of the inventive concepts may substantially reduce the number of detection steps for detecting the center of the data signal DQ in the data training operation. The controller 110 may reduce the number of detection steps for detecting the edge of the data signal DQ by using the unit interval length information 112 of the data signal DQ stored in the delay locked loop circuit 118.

Accordingly, a time taken to perform the data training operation may be substantially reduced.

Figure 3:
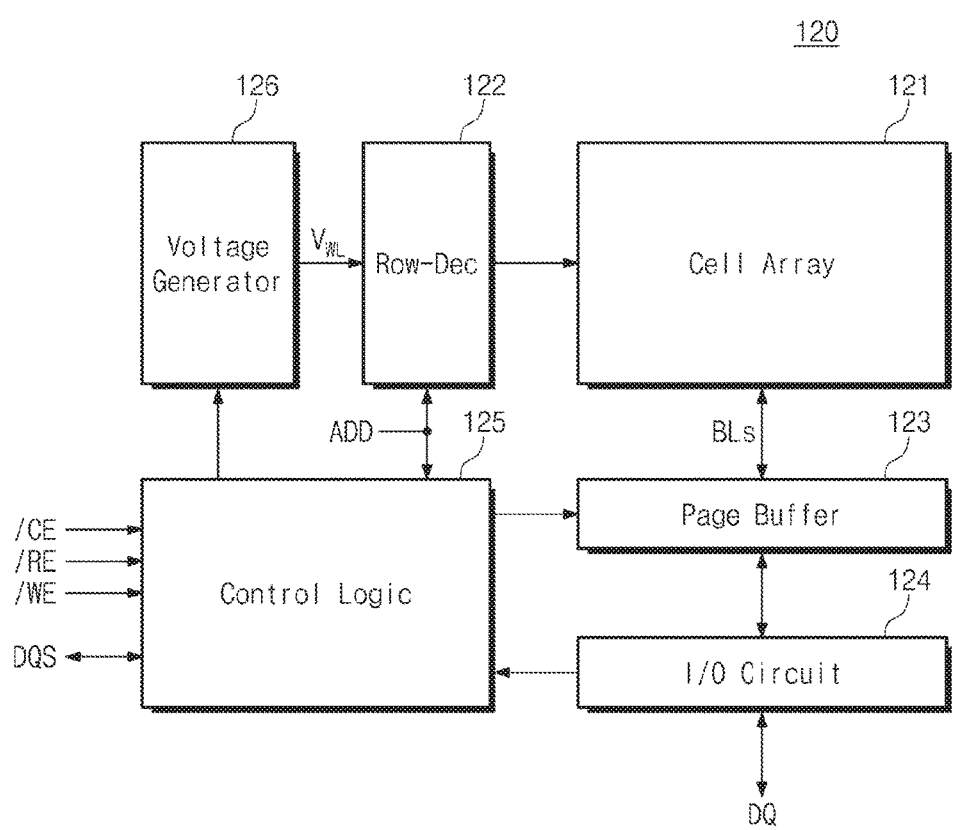
FIG. 3 is a block diagram illustrating a nonvolatile memory device of FIG. 1.

FIG. 3 is a block diagram illustrating a nonvolatile memory device of FIG. 1. Referring to FIG. 3, the nonvolatile memory device 120 may include a cell array 121, a row decoder 122, a page buffer 123, an input/output circuit 124, control logic 125, and a voltage generator 126.

The cell array 121 may be connected to the row decoder 122 through word lines WL and/or selection lines SSL and GSL. The cell array 121 may be connected to the page buffer 123 through bit lines BLs. The cell array 121 may include a plurality of cell strings formed in a NAND type. The cell strings may constitute a memory block BLK. Here, a channel of each cell string may be formed in a vertical or horizontal direction. The memory cells included in the cell array 121 may be programmed by voltages that are provided to a word line and bit lines.

In an example embodiment, the cell array 121 may be implemented with a three dimensional (3D) memory array. The 3-dimensional memory array may be monolithically formed in one or more physical level(s) of a memory cell array having an active area arranged on a circuit related on a silicon substrate and an operation of memory cells. The circuit related to an operation of memory cells may be located in a substrate or on a substrate. The term "monolithic" means that layers of each level of the array are directly deposited on the layers of each underlying level of the array.

The row decoder 122 may select one of memory blocks of the cell array 121 in response to an address ADD. The row decoder 122 may select one of word lines of the selected memory block. The row decoder 122 may transfer a word line voltage $V_{WL}$ from the voltage generator 126 to the selected word line.

The page buffer 123 may operate as a write driver in a program operation and as a sense amplifier in a read operation. In the program operation, the page buffer 123 may supply a bit line voltage corresponding to to-be-programmed data to a bit line of the cell array 121. In the read operation, the page buffer 123 may sense data stored in a selected memory cell through a bit line. The page buffer 123 may latch the sensed data and outputs the latched data to the input/output circuit 124. The page buffer 123 of the inventive concepts may be used as a first-in first-out (FIFO) buffer that stores a training pattern in a data training operation. That is, in a write training operation, the training pattern may be output after being stored in the page buffer 123, without storing the training pattern in the cell array 121.

The input/output circuit 124 may transmit write data received in the program operation to the page buffer 123. The input/output circuit 124 may output data provided from the page buffer 123 to outside in the read operation. The input/output circuit 124 may transmit the received address ADD or the received command to the row decoder 122 or the control logic 125.

The control logic 125 may control the page buffer 123 and the voltage generator 126 in response to a command and control signals /CE, /RE, /WE, and/or DQS transmitted from outside. The control logic 125 may control the page buffer 123 and the input/output circuit 124 in response to an access command provided from the controller 110 such that data are received or data of a specific pattern are output during one detection step. The data training operation may be equally applied to write training as well as read training.

The voltage generator 126 may generate various word line voltages $V_{WL}$ to be supplied to word lines and a voltage to be supplied to a bulk (e.g., a well area) in which memory cells are formed, under control of the control logic 125. The word line voltages to be supplied to the word lines include a program voltage Vpgm (not shown), a pass voltage Vpass (not shown), selection and non-selection read voltages Vrd and Vread (not shown), etc.

Figure 4:
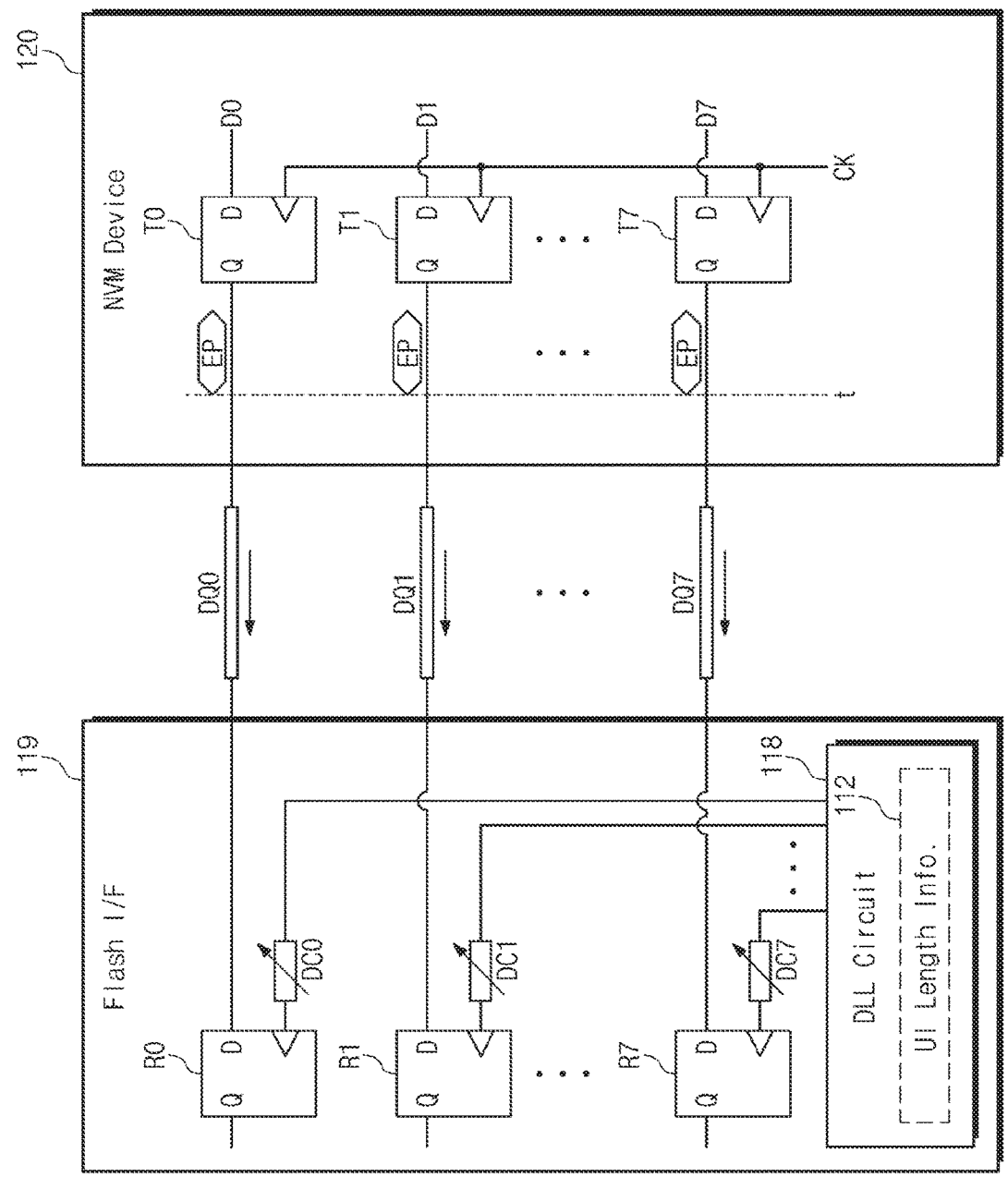
FIG. 4 is a block diagram illustrating read training according to an example embodiment of the inventive concepts.

FIG. 4 is a block diagram illustrating read training according to an example embodiment of the inventive concepts. Referring to FIG. 4, in read training, the flash interface 119 (refer to FIG. 2) may adjust an appropriate or optimum sampling point of data signals DQ0 to DQ7 provided from the nonvolatile memory device 120.

The nonvolatile memory device 120 may transmit the data strobe signal DQS (not illustrated) and the data signals DQ0 to DQ7 to the flash interface 119 in response to the read enable signal /RE. Transmission latches T0 to T7 of the nonvolatile memory device 120 may transmit data D0 to D7 to the flash interface 119 in response to the clock signal CK. Here, the data D0 to D7 may constitute a training pattern. The clock signal CK may be generated by using the read enable signal /RE transmitted from the flash interface 119. In this case, the nonvolatile memory device 120 may transmit the data signals DQ0 to DQ7 of an aligned form to the flash interface 119. As illustrated in FIG. 4, the transmission latches T0 to T7 may transmit the data signals DQ0 to DQ7 aligned to have eye patterns EP of the same edge or center, respectively.

Reception latches R0 to R7 of the flash interface 119 may sample the data signals DQ0 to DQ7 transmitted from the nonvolatile memory device 120. The nonvolatile memory device 120 may output, for example, the data signals DQ0 to DQ7 of the center-aligned eye pattern EP. However, the data signals DQ0 to DQ7 transmitted to the flash interface 119 may have different delays for the respective data lines due to various factors. The read training refers to adjusting a sampling point of the data signals DQ0 to DQ7 provided from the nonvolatile memory device 120.

However, an operation of detecting the center of each of the data signals DQ0 to DQ7 may be first performed to adjust the sampling point of the data signals DQ0 to DQ7 to the center. However, the left edge LE or the right edge RE of each of the data signals DQ0 to DQ7 may need to be detected to detect the center of each of the data signals DQ0 to DQ7. If the left edge LE and the right edge RE of each of the data signals DQ0 to DQ7 are detected, a middle point between the detected left and right edges LE and RE of each data signal may be determined as the center of each data signal. To detect the right edge RE after the left edge LE is detected, however, a considerable number of detection steps need to be executed consecutively, and thus a relatively long time may be taken.

If the left edge LE is detected, the flash interface 119 of the inventive concepts may skip a detection step to a point estimated as the right edge RE is located, by using unit interval length information of the delay locked loop circuit 118. Accordingly, even though the number of detection steps for accessing the nonvolatile memory device 120 is substantially reduced, the right edge RE of the data signal DQ may be properly detected. In another example embodiment, if the left edge LE is detected, the flash interface 119 of the inventive concepts terminates a detection step for detecting an edge. The flash interface 119 may determine the center of the data signal DQ by adding one half 0.5 UI of the unit interval length information to the detected left edge LE.

According to the training method of the inventive concepts, the number of detection steps desired to detect the right edge RE may be substantially reduced. In another example embodiment, even though only the left edge LE is detected, the center of the data signal DQ may be properly determined without detecting the right edge RE. Accordingly, a time taken for data training through the data training manner of the inventive concepts may be substantially reduced.

A write training operation refers to an operation for adjusting a write timing offset of data to be transmitted from the flash interface 119. The write training operation is similar to the read training operation except that the data signal DQ input to the nonvolatile memory device 120 is aligned. Accordingly, a detailed description of the write training operation will not be repeated here.

Figure 5:
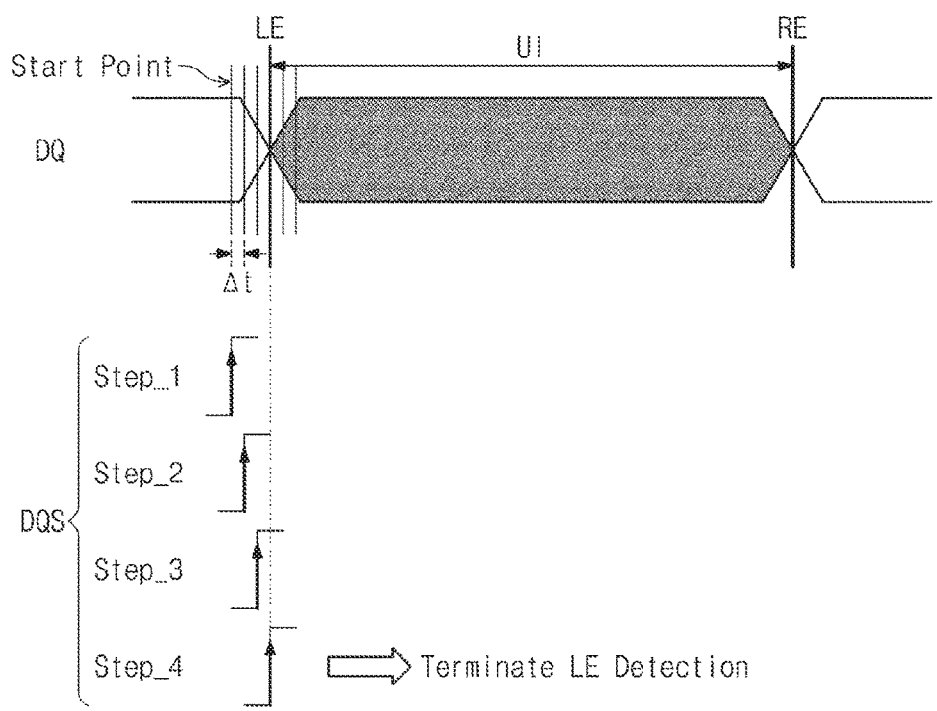
FIG. 5 is a view illustrating an operation of detecting a left edge of a data signal, according to an example embodiment of the inventive concepts.

FIG. 5 is a view illustrating an operation of detecting the left edge LE of the data signal DQ, according to an embodiment of the inventive concepts. Referring to FIG. 5, in read training, the controller 110 executes a plurality of detection steps for the purpose of detecting the left edge LE of the data signal DQ.

First, the controller 110 may determine a start point to detect the left edge LE of the data signal DQ. The start point may be determined with reference to a transition point of the read enable signal /RE transmitted from the controller 110 to the nonvolatile memory device 120 because the data strobe signal DQS output from the nonvolatile memory device 120 is generated based on the read enable signal /RE.

If the start point of detection step is determined, a first step Step_1 of the detection step starts. The controller 110 may provide a command and an address sequence to the nonvolatile memory device 120 so as to output data of a specific pattern. Here, the specific pattern means a training pattern determined, for example, in advance for comparison of logical values of the data signal DQ. If the controller 110 toggles the read enable signal /RE, the nonvolatile memory device 120 may output the data strobe signal DQS and the data signal DQ.

A rising edge of the data strobe signal DQS in the first step Step_1 may be advanced by a plurality of step intervals kΔt (k being a natural number) with respect to the left edge LE of the unit interval UI. The controller 110 compares read data transmitted through the data signal DQ and a reference pattern determined, for example, in advance. The controller 110 may determine whether the rising edge of the data strobe signal DQS corresponds to the left edge LE of the data signal DQ, by using the comparison result. If it is determined that the rising edge of the data strobe signal DQS is not matched with the left edge LE of the data signal DQ, the controller 110 may execute a second step Step_2 following the first step Step_1.

To execute the second step Step_2, the controller 110 may transmit a command and an address to the nonvolatile memory device 120. If the controller 110 toggles the read enable signal /RE, the nonvolatile memory device 120 may output data of a specific pattern through the data strobe signal DQS and the data signal DQ. The controller 110 may compare the transmitted data and the reference pattern to determine whether the rising edge of the data strobe signal DQS corresponds to the left edge LE of the data signal DQ. If it is determined in the second detection step Step_2 that the rising edge of the data strobe signal DQS is not matched with the left edge LE of the data signal DQ, the controller 110 may execute a third step Step_3 following the second step Step_2.

The third step Step_3 among detection steps may be executed in the same manner as the second step Step_2. In an example embodiment, it is assumed that the left edge LE is detected in a fourth step Step_4. According to this assumption, the execution result of the third step Step_3 for detecting the left edge LE may indicate that data read from the nonvolatile memory device 120 is not a value corresponding to the left edge LE. For this reason, the fourth step Step_4 may be executed. As the execution result of the fourth step Step_4 of the detection step, the controller 110 may determine that the left edge LE is detected. In this case, the detection step for detecting the left edge LE ends.

In the data training method according to an example embodiment of the inventive concepts, if the left edge LE of the data signal DQ is detected, the progress of the detection step may be temporarily suspended at a point in time when the left edge LE is detected. In this case, the controller 110 may fetch unit interval length information from the delay locked loop circuit 118. Detection steps from the left edge LE to a detection start point of the right edge RE may be skipped. This will be described in detail with reference to FIG. 6.

Figure 6:
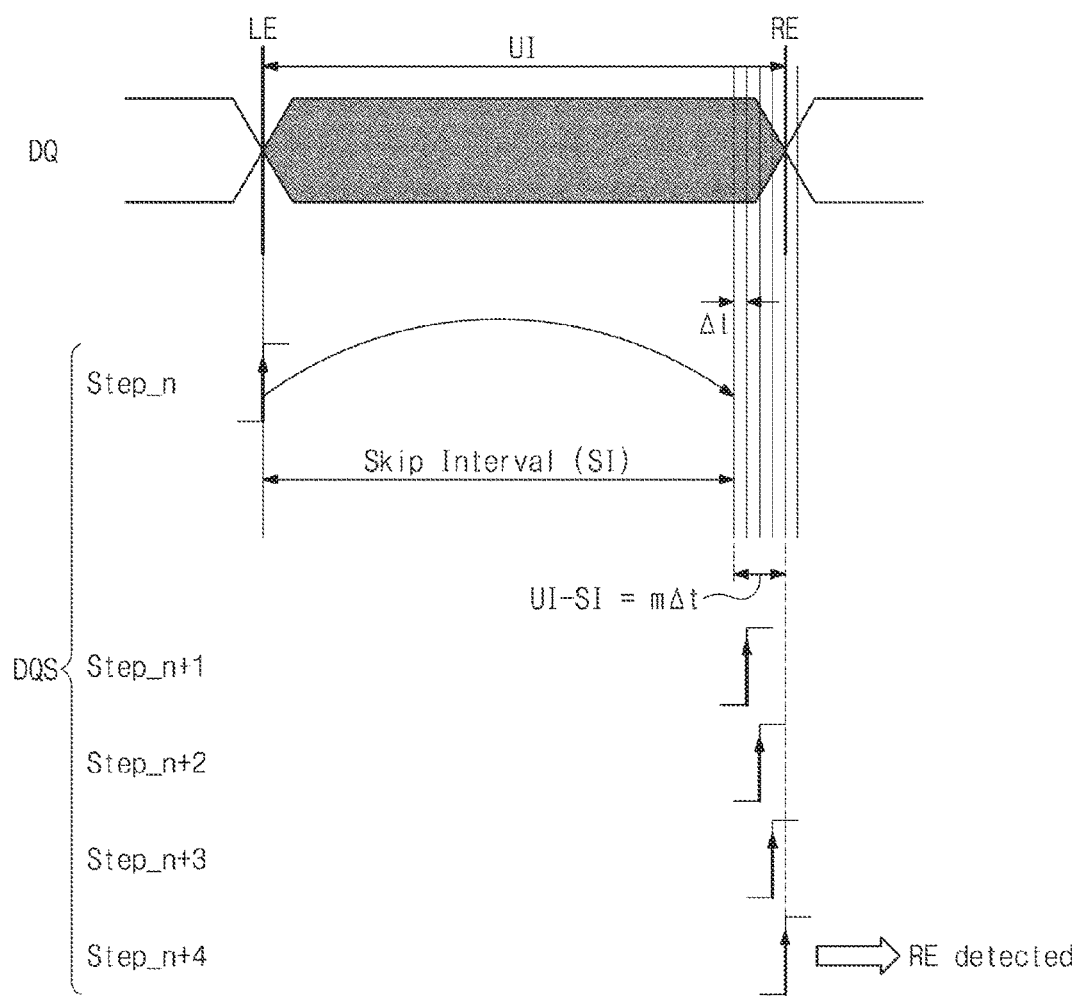
FIG. 6 is a view illustrating an operation of detecting a right edge of a data signal, according to an example embodiment of the inventive concepts.

FIG. 6 is a view illustrating an operation of detecting the right edge RE of the data signal DQ, according to an example embodiment of the inventive concepts. Referring to FIG. 6, in read training, if the left edge LE of the data signal DQ is detected, the controller 110 may jump a detection step to a location estimated as the right edge RE exists. The number of steps jumped may be determined by using unit interval length information.

Assuming that the left edge LE is detected at an n-th step Step_n, the next detection step Step_n+1 starts at a location shifted as much as a skip interval SI. The skip interval SI may be determined by using unit interval length information provided from the delay locked loop circuit 118. That is, a length of the skip interval SI may set to the magnitude that corresponds to a length of the unit interval UI or is smaller than the length of the unit interval UI. In the case where the length of the skip interval SI is set to be shorter than the length of the unit interval UI, the (n+1)-th step Step_n+1 may be executed before at least one step interval with respect to the right edge RE.

In the (n+1)-th step Step_n+1, the controller 110 may transmit a command and an address to the nonvolatile memory device 120 to detect the right edge RE. If the controller 110 toggles the read enable signal /RE, the nonvolatile memory device 120 may output the data strobe signal DQS and the data signal DQ. A rising edge of the data strobe signal DQS in the (n+1)-th step Step_n+1 may be advanced by a plurality of step intervals mot (m being a natural number) with respect to the right edge RE. That is, the execution point of the (n+1)-th step Step_n+1 may be determined to have a margin as much as, for example, a time of (UI-SI).

Data read in the (n+1)-th step Step_n+1 may be compared with a pre-determined (or alternatively, desired) reference pattern. The controller 110 may determine whether the rising edge of the data strobe signal DQS corresponds to the right edge RE of the data signal DQ, by using the comparison result. If it is determined that the rising edge of the data strobe signal DQS is not matched with the right edge RE of the data signal DQ, the controller 110 may execute a next (n+2)-th step Step_n+2.

To execute the (n+2)-th step Step_n+2, the controller 110 may transmit a command and an address to the nonvolatile memory device 120. If the controller 110 toggles the read enable signal /RE, the nonvolatile memory device 120 may output data of a specific pattern through the data strobe signal DQS and the data signal DQ. The controller 110 may compare the transmitted data and a pre-determined (or alternatively, desired) specific pattern to determine whether the rising edge of the data strobe signal DQS corresponds to the right edge RE of the data signal DQ. If it is determined in the (n+2)-th step Step_n+2 that the rising edge of the data strobe signal DQS is not matched with the right edge RE of the data signal DQ, the controller 110 may execute a (n+3)-th step Step_n+3.

The (n+3)-th step Step_n+3 among detection steps may be executed in the same manner as the (n+2)-th step Step_n+2. In an example embodiment, it is assumed that the right edge RE is detected in a (n+4)-th step Step_n+4. According to this assumption, the execution result of the (n+3)-th step Step_n+3 for detecting the right edge RE may indicate that data read from the nonvolatile memory device 120 is not a value corresponding to the right edge RE. Then, the (n+4)-th step Step_n+4 may be executed. As the execution result of the (n+4)-th step Step_n+4, the controller 110 may determine that data read from the nonvolatile memory device 120 corresponds to the right edge RE. In this case, the detection step for detecting the right edge RE ends.

If the right edge RE of the data signal DQ is detected, the controller 110 may determine the middle of the left edge LE and the right edge RE as the center of the data signal DQ. If the center of the data signal DQ is detected, the controller 110 may align a sampling point of the data signal DQ to the center and may complete the above-described read training.

According to the data training method described with reference to FIGS. 5 and 6, not all detection steps need to be applied during the unit interval UI of the data signal DQ to detect the right edge RE of the data signal DQ. If the left edge LE is detected, the controller 110 may read unit interval length information from the delay locked loop circuit 118 (refer to FIG. 2) to jump detection steps to the vicinity of the right edge RE. According to the training method of the inventive concepts, thus, the number of detection steps needed to detect the right edge RE may be reduced or minimized. A time taken for data training and an open timing of the storage device 100 may decrease because a time taken for detection of the right edge RE is substantially reduced.

Figure 7:
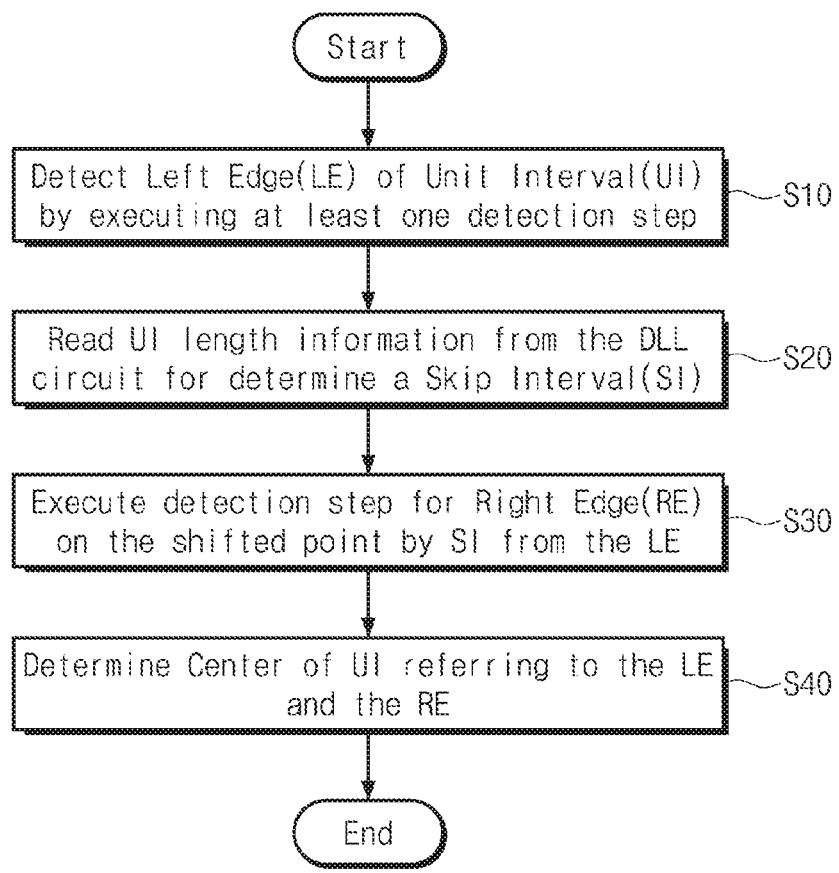
FIG. 7 is a flowchart illustrating a data training method of the storage device according to an example embodiment of the inventive concepts.

FIG. 7 is a flowchart illustrating a data training method of a storage device according to an example embodiment of the inventive concepts. Referring to FIG. 7, the storage device 100 of the inventive concepts may reduce the number of detection steps used to detect the right edge RE of the data signal DQ.

In operation S10, the controller 110 may execute at least one detection step to detect the left edge LE of the data signal (DQ) window. The data signal window may correspond to, for example, one unit interval UI of the eye pattern of the data signal.

In operation S20, the controller 110 may fetch unit interval length information from the delay locked loop circuit 118 in response to detecting the left edge LE of the data signal window. The controller 110 may calculate the skip interval SI based on the fetched unit interval length information. The skip interval SI may correspond to the number of skipped detection steps desired for detection of the right edge RE or time information corresponding to the number of skipped detection steps.

In operation S30, the controller 110 may execute a detection step for detecting the right edge RE of the data signal window at a point shifted from the left edge LE as much as, for example, a length of the skip interval SI. In the case where data read through the execution of the detection step coincides with a reference pattern, the controller 110 may determine a current detection point as the right edge RE.

In operation S40, the controller 110 may determine the center of the data signal window by using the detected left edge LE and temporal information of the right edge RE. For example, the controller 110 may determine the middle between the left edge LE and the right edge RE as the center of the data signal window. Afterwards, although not illustrated in FIG. 7, the controller 110 may complete the data training process after adjusting a sampling point or a transmission point to the center of the data signal window.

As described above, if the left edge LE of the data signal DQ is detected, detection steps may be skipped until a point estimated as the right edge RE exists using unit interval length information. If the right edge RE is detected after again performing the detection step from the point estimated as the right edge RE exists, the process may end. According to the training method, the number of detection steps needed to detect the right edge RE may be substantially reduced.

Figure 8:
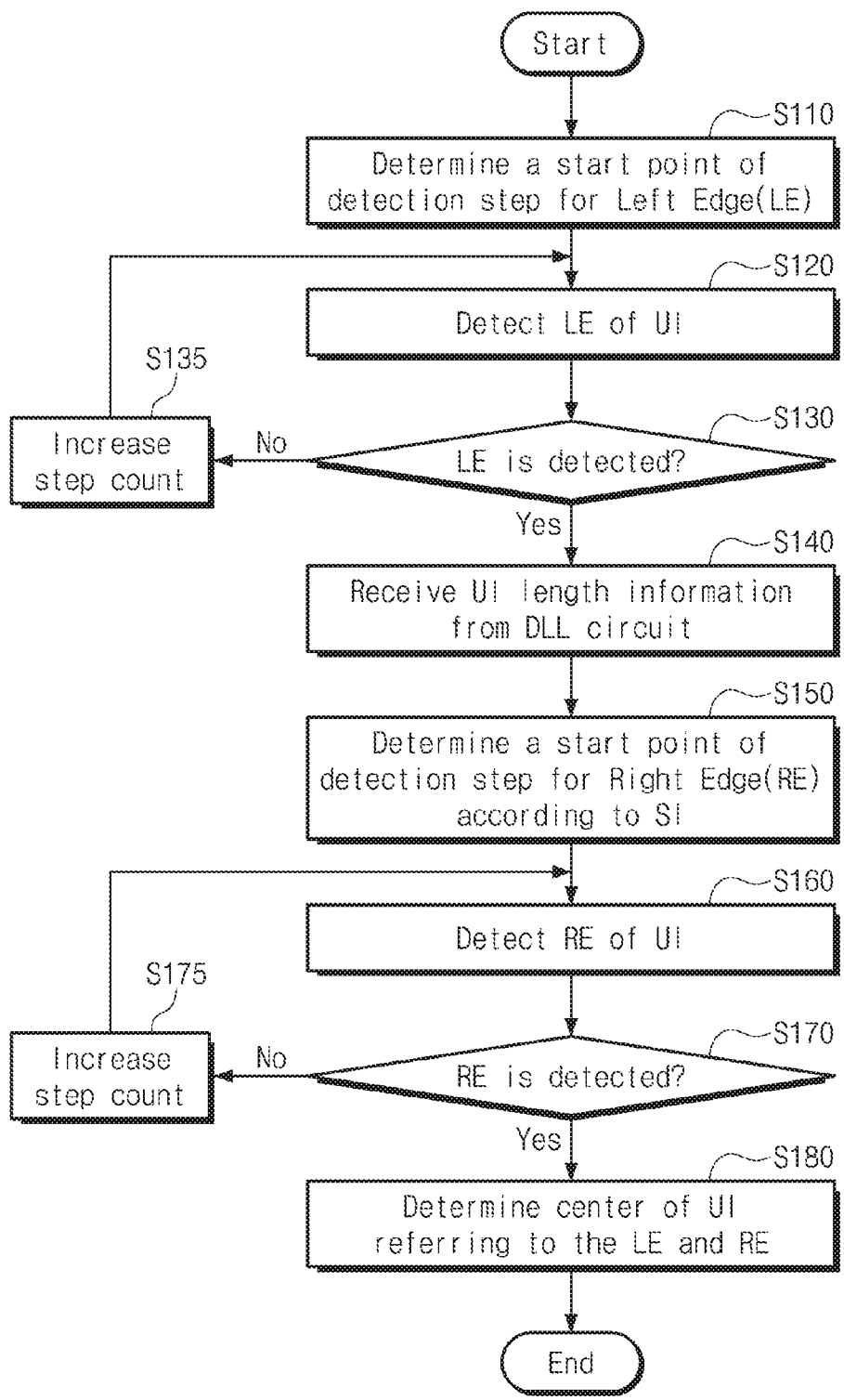
FIG. 8 is a detailed flowchart illustrating a data training method of FIG. 7.

FIG. 8 is a detailed flowchart illustrating a data training method of FIG. 7. Referring to FIG. 8, the storage device 100 of the inventive concepts may reduce or minimize a time needed to detect the right edge RE of the data signal DQ.

In operation S110, the controller 110 may determine a start point of detection step for detecting the left edge LE of the data signal DQ. The controller 110 may determine the start point of detection step for each data line. The controller 110 may determine the start point of detection step with reference to an offset provided in the delay locked loop circuit 118 or by using an initial setting value of the nonvolatile memory device 120. However, it may be well understood that a method of determining a start point of detection step is not limited to this disclosure.

In operation S120, the controller 110 may access the nonvolatile memory device 120 to detect the left edge LE of the data signal DQ. The controller 110 may transmit a command and an address to the nonvolatile memory device 120 and toggle the read enable signal /RE. The nonvolatile memory device 120 may output the data signal DQ and a data strobe signal DQS in response to toggling of the read enable signal /RE. The controller 110 may compare read data transmitted through the data signal DQ and a stored reference pattern.

In operation S130, the controller 110 may determine whether a rising edge of the data strobe signal DQS corresponds to the left edge LE of the data signal DQ by using the comparison result. If it is determined that the rising edge of the data strobe signal DQS is not matched with the left edge LE of the data signal DQ (No), the procedure may proceed to operation S135. If it is determined that the rising edge of the data strobe signal DQS is matched with the left edge LE of the data signal DQ (Yes), the procedure may proceed to operation S140.

In operation S135, the controller 110 may increase a step count to perform a next detection step for detecting the left edge LE of the data signal DQ. For example, in the case of failing in detection of the left edge LE in the first step Step_1, in operation S135, the controller 110 may increase the step count to "2" for the purpose of performing the second step Step_2. After operation S135 is performed, the procedure may proceed to operation S120 to perform the detection step of the second step Step_2.

If the left edge LE of the data signal DQ is detected, in operation S140, the controller 110 may read unit interval length information. For example, the controller 110 may read the unit interval length information being size information of delay chains from the delay locked loop circuit 118 (refer to FIG. 2). However, it may be well understood by ones skilled in the art that a target from which the unit interval length information is obtained is not limited to the delay locked loop circuit 118.

In operation S150, the controller 110 may determine a location predicted as the right edge RE is present on the window of the data signal DQ by using the unit interval length information. That is, the controller 110 may determine the skip interval SI for skipping detection steps from the detected left edge LE by using the unit interval length information. The skip interval SI may be set to be the same as the length of the unit interval UI or to be shorter than the length of the unit interval UI. To detect the right edge RE with relatively high reliability, the length of the skip interval SI may be set to be shorter than the length of the unit interval UI. The controller 110 may determine a start point for detecting the right edge RE based on the skip interval SI.

In operation S160, the controller 110 may start a detection step for detecting the right edge RE at a point shifted from the left edge LE as much as the skip interval SI. The controller 110 may transmit a command and an address to the nonvolatile memory device 120 to detect the right edge RE at the shifted point. If the controller 110 toggles the read enable signal /RE, the nonvolatile memory device 120 may output the data strobe signal DQS and the data signal DQ.

In operation S170, the controller 110 may compare data transmitted through the data signal DQ and a stored reference pattern. The controller 110 may determine whether the rising edge of the data strobe signal DQS corresponds to the right edge RE of the data signal DQ by using the comparison result. If it is determined that the rising edge of the data strobe signal DQS is not matched with the right edge RE of the data signal DQ (No), the procedure may proceed to operation S175. If it is determined that the rising edge of the data strobe signal DQS is matched with the right edge RE of the data signal DQ (Yes), the procedure may proceed to operation S180.

In operation S175, the controller 110 may increase a step count to perform a next detection step for detecting the right edge RE of the data signal DQ. After operation S175 is performed, the procedure may proceed to operation S160 for performing an additional detection step.

In operation S180, the controller 110 may determine a middle point between the detected left edge LE and the right edge RE as the center of the data signal DQ. If the center of the data signal DQ is detected, the controller 110 may adjust an offset value of the delay locked loop circuit 118 to align a sampling point of the data signal DQ to the determined center. Afterwards, the controller 110 may complete the above-described read training.

As described above, if the left edge LE of the data signal DQ is detected, detection steps may be skipped until a point estimated as the right edge RE exists using unit interval length information. If a detection step is executed from the point estimated as the right edge RE exists and the right edge RE is detected, the process may end. According to the training method, the number of detection steps needed to detect the right edge RE may be substantially reduced.

Figure 9:
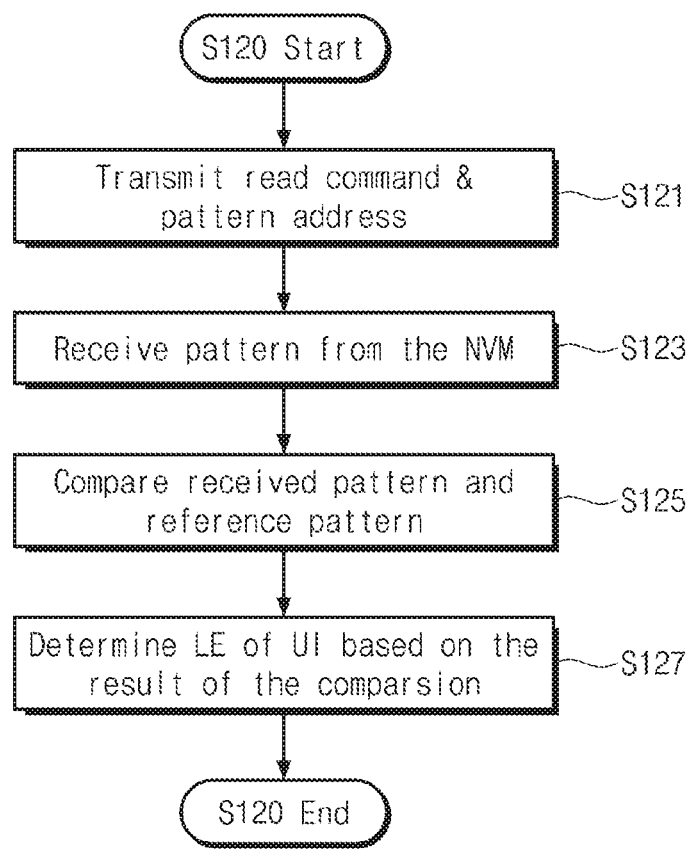
FIG. 9 is a detailed flowchart for describing operation S120 of FIG. 8.

FIG. 9 is a detailed flowchart for describing operation S120 of FIG. 8. Referring to FIG. 9, the controller 110 may provide a command and an address to the nonvolatile memory device 120 to perform one detection step for detecting the left edge LE. The controller 110 may compare output pattern data and a reference pattern to detect the left edge LE.

In operation S121, the controller 110 may transmit a command and an address to the nonvolatile memory device 120 to detect the right edge RE. For example, the controller 110 may provide a read command and a pattern address such that pattern data provided for training are output from the nonvolatile memory device 120. The nonvolatile memory device 120 may store the pattern data corresponding to the pattern address in the transmission latches (e.g., T0 to T7 of FIG. 4).

In operation S123, if the controller 110 toggles the read enable signal /RE, the nonvolatile memory device 120 may output the data strobe signal DQS and the data signal DQ. The nonvolatile memory device 120 may output the data strobe signal DQS with reference to the read enable signal /RE.

In operation S125, the controller 110 may compare the received pattern data and a reference pattern. If a rising edge of the data strobe signal DQS coincides with the left edge LE of the data signal DQ, the received pattern data and the reference pattern may be identified as the same data. However, if the rising edge of the data strobe signal DQS does not coincide with the left edge LE of the data signal DQ, the received pattern data and the reference pattern may be different from each other.

In operation S127, the controller 110 may determine whether the rising edge of the data strobe signal DQS coincides with the left edge LE of the data signal DQ by using the comparison result of the received pattern data and the reference pattern. If the received pattern data and the reference pattern coincide with each other, the controller 110 may determine the left edge LE of the data signal DQ is detected.

One detection step for detecting the left edge LE is described above. However, it may be well understood by ones skilled in the art that a detection step for detecting the right edge RE may be performed according to substantially the same procedure.

Figure 10:
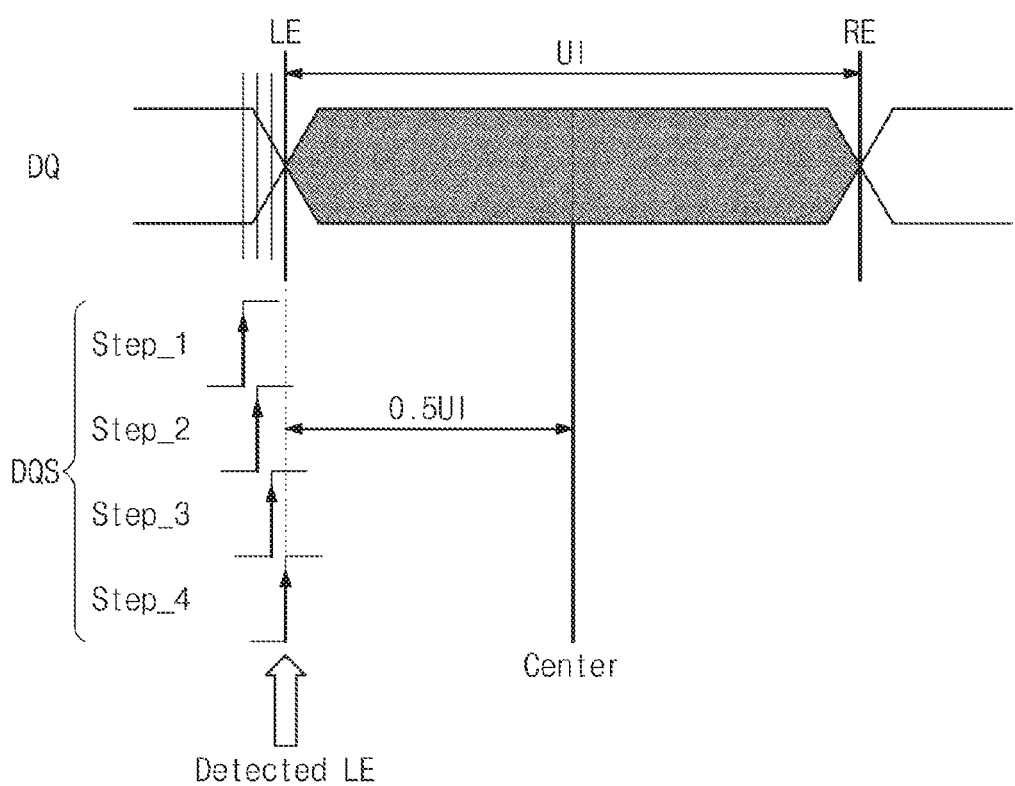
FIG. 10 is a view illustrating a data training method according to another example embodiment of the inventive concepts.

FIG. 10 is a view illustrating a data training method according to another example embodiment of the inventive concepts. Referring to FIG. 10, once the left edge LE of the data signal DQ is detected in read training, the controller 110 may determine the center of the data signal DQ without executing an additional detection step.

The controller 110 may determine a start point to detect the left edge LE of the data signal DQ. The controller 110 may refer to various parameters to determine a point close to the left edge LE as the start point of detection step. For example, the controller 110 may determine the start point of detection step with reference to a setting value of a delay chain of the data signal DQ.

If the start point is determined, the controller 110 may execute a first step Step_1 of the detection step. The controller 110 may provide a command and a pattern address to the nonvolatile memory device 120 so as to output data of a specific pattern. Here, the specific pattern means a training pattern, which is, for example, determined in advance, for comparison of logical values of the data signal DQ. If the controller 110 toggles the read enable signal /RE following the command and the pattern address, the nonvolatile memory device 120 may output the data strobe signal DQS and the data signal DQ.

The controller 110 may compare pattern data transmitted through the data signal DQ and a reference pattern. The controller 110 may determine whether the rising edge of the data strobe signal DQS corresponds to the left edge LE of the data signal DQ by using the comparison result. If it is determined that the rising edge of the data strobe signal DQS is not matched with the left edge LE of the data signal DQ, the controller 110 may execute a second step Step_2 following the first step Step_1.

To execute the second step Step_2, the controller 110 may transmit a command and a pattern address to the nonvolatile memory device 120. If the controller 110 toggles the read enable signal /RE, the nonvolatile memory device 120 may output the data strobe signal DQS and the data signal DQ. The controller 110 may compare the transmitted pattern data and the pre-determined (or alternatively, desired) reference pattern to determine whether the rising edge of the data strobe signal DQS corresponds to the left edge LE of the data signal DQ. If it is determined in the second detection step Step_2 that the rising edge of the data strobe signal DQS is not matched with the left edge LE of the data signal DQ, the controller 110 may execute a third step Step_3 following the second step Step_2.

The third step Step_3 among detection steps may be executed in the same manner as the second step Step_2. In an example embodiment, it is assumed that the left edge LE is detected in a fourth step Step_4. According to this assumption, the execution result of the third step Step_3 for detecting the left edge LE may indicate that data read from the nonvolatile memory device 120 is not a value corresponding to the left edge LE. Then, the fourth step Step_4 may be executed. As the execution result of the fourth step Step_4, the controller 110 may determine that data read from the nonvolatile memory device 120 corresponds to the left edge LE. If the left edge LE is detected, execution of detection steps may end in this example embodiment. Further, in this example embodiment, detection steps for detecting the right edge RE may not be executed.

If the left edge LE is detected, the controller 110 may fetch unit interval length information from, for example, the delay locked loop circuit 118. The controller 110 may add one half 0.5 UI of the unit interval length UI to the detected left edge LE to determine the center of the data signal DQ. In this example embodiment, the controller 110 may detect only the left edge LE to determine the center of the data signal DQ. Accordingly, the number of times that an access to the nonvolatile memory device 120 is made for data training may be substantially reduced. In other words, a time needed to perform the data training operation may be substantially reduced.

Figure 11:
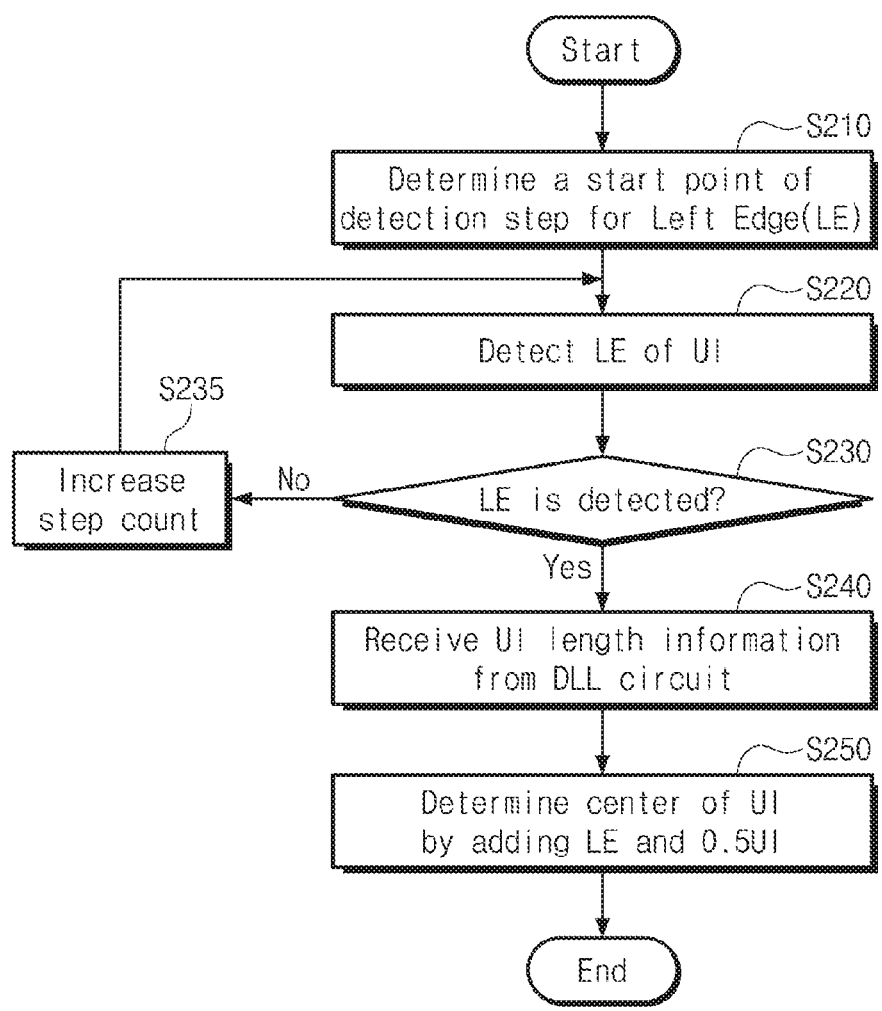
FIG. 11 is a flowchart illustrating a data training method according to another example embodiment of the inventive concepts.

FIG. 11 is a flowchart illustrating a data training method according to another example embodiment of the inventive concepts. Referring to FIG. 11, the storage device 100 may detect only the left edge LE of the data signal DQ to determine the center of the data signal DQ.

In operation S210, the controller 110 may determine a start point of a detection step for detecting the left edge LE of the data signal DQ. The controller 110 may determine the start point of the detection step for each data line. The controller 110 may determine a start point of detection step with reference to an offset provided in the delay locked loop circuit 118 or by using an initial setting value of the nonvolatile memory device 120.

In operation S220, the controller 110 may access the nonvolatile memory device 120 to detect the left edge LE of the data signal DQ. The controller 110 may transmit a command and an address to the nonvolatile memory device 120 and toggle the read enable signal /RE. The nonvolatile memory device 120 may output the data signal DQ and a data strobe signal DQS in response to toggling of the read enable signal /RE. The controller 110 may compare pattern data transmitted through the data signal DQ and a reference pattern.

In operation S230, the controller 110 may determine whether a rising edge of the data strobe signal DQS corresponds to the left edge LE of the data signal DQ by using the comparison result. If it is determined that the rising edge of the data strobe signal DQS is not matched with the left edge LE of the data signal DQ (No), the procedure may proceed to operation S235. If it is determined that the rising edge of the data strobe signal DQS is matched with the left edge LE of the data signal DQ (Yes), the procedure may proceed to operation S240.

In operation S235, the controller 110 may increase a step count to perform a next detection step for detecting the left edge LE of the data signal DQ. For example, in the case of failing in detection of the left edge LE in the first step Step_1, in operation S235, the controller 110 may increase the step count to "2" for the purpose of performing the second step Step_2. After operation S235 is performed, the procedure may return to operation S220 to perform the detection step of the second step Step_2.

If the left edge LE of the data signal DQ is detected, in operation S240, the controller 110 may read unit interval length information. For example, the controller 110 may read the unit interval length information being size information of delay chains from the delay locked loop circuit 118 (refer to FIG. 2). However, it may be well understood by ones skilled in the art that a source from which the unit interval length information is read is not limited to the delay locked loop circuit 118.

In operation S250, the controller 110 may calculate a location of the center of the data signal DQ by using the unit interval length information. For example, if the left edge LE is detected, the controller 110 may add one half 0.5 UI of the unit interval UI to the left edge LE to calculate a location of the center. In this case, the controller 110 may detect only the left edge LE to determine the center of the data signal DQ. Accordingly, the number of times that an access to the nonvolatile memory device 120 is made for data training may be substantially reduced. In other words, a time needed to perform the data training operation may be substantially reduced.

The various operations of methods described above may be performed by any suitable means capable of performing the operations, such as various hardware and/or software component(s), circuits, and/or module(s).

The software may comprise an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the example embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

Figure 12:
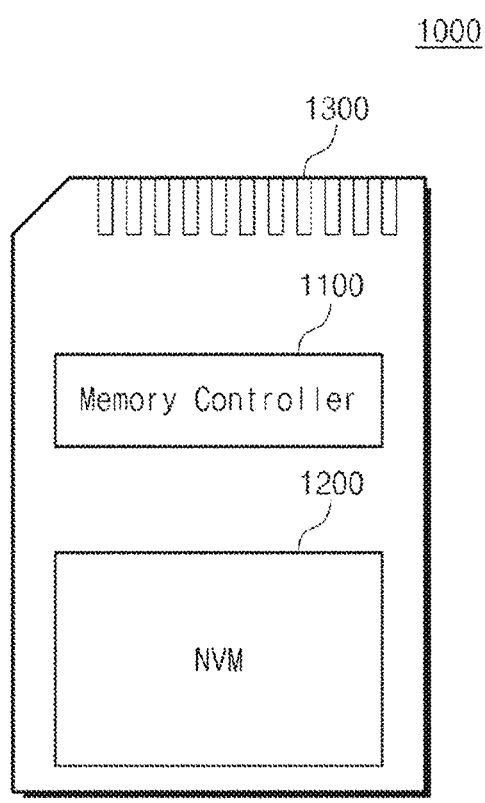
FIG. 12 is a block diagram illustrating a memory card system according to an example embodiment of the inventive concepts.

FIG. 12 is a block diagram illustrating a memory card system according to example embodiments of the inventive concepts. Referring to FIG. 12, a memory card system 1000 may include a memory controller 1100, a nonvolatile memory 1200, and a connector 1300.

The memory controller 1100 may be connected with the nonvolatile memory 1200. The memory controller 1100 may be configured to access the nonvolatile memory 1200. For example, the memory controller 1100 may be configured to control a read operation, a write operation, an erase operation, and/or a background operation of the nonvolatile memory 1200. The background operation may include operations such as a wear-leveling management operation and a garbage collection operation. In an example embodiment, the memory controller 1100 may allow a decrease in an over-provision area of the nonvolatile memory 1200 including a plurality of sub-storage devices not to be focused on any one device.

The memory controller 1100 may be configured to provide an interface between the nonvolatile memory 1200 and a host. The memory controller 1100 may be configured to drive firmware for controlling the nonvolatile memory 1200. In an example embodiment, the memory controller 1100 may include elements such as a random access memory (RAM), a processor, a host interface, a memory interface, and an error correction unit.

The memory controller 1100 may communicate with an external device through the connector 1300. The memory controller 1100 may communicate with an external device (e.g., a host) in compliance with a specific communication protocol. For example, the memory controller 1100 may communicate with the external device through at least one of various communication protocols such as, but not limited to, universal serial bus (USB), multimedia card (MMC), eMMC (embedded MMC), peripheral component interconnection (PCI), PCI-express (PCI-E), advanced technology attachment (ATA), serial-ATA, parallel-ATA, small computer small interface (SCSI), enhanced small disk interface (ESDI), integrated drive electronics (IDE), Firewire, universal flash storage (UFS), and nonvolatile memory express (NVMe). In an embodiment, a write command defined by the above-described standards may include size information of write data.

The nonvolatile memory 1200 may be implemented with a variety of nonvolatile memory devices, such as, but not limited to, an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

In an example embodiment, the memory controller 1100 and the nonvolatile memory 1200 may be integrated in a single semiconductor device. The memory controller 1100 and the nonvolatile memory 1200 may be integrated in a single semiconductor device to form a solid state drive (SSD). The memory controller 1100 and the nonvolatile memory 1200 may be integrated in a single semiconductor device to constitute a memory card. For example, the memory controller 1100 and the nonvolatile memory 1200 may be integrated in a single semiconductor device to form a memory card such as a PC card (a personal computer memory card international association (PCMCIA) card), a compact flash card (CF), a smart media card (SM, SMC), a memory stick, a multimedia card (MMC, RS-MMC, MMC-micro, eMMC), an SD card (SD, miniSD, microSD, SDHC), and a universal flash storage (UFS).

Figure 13:
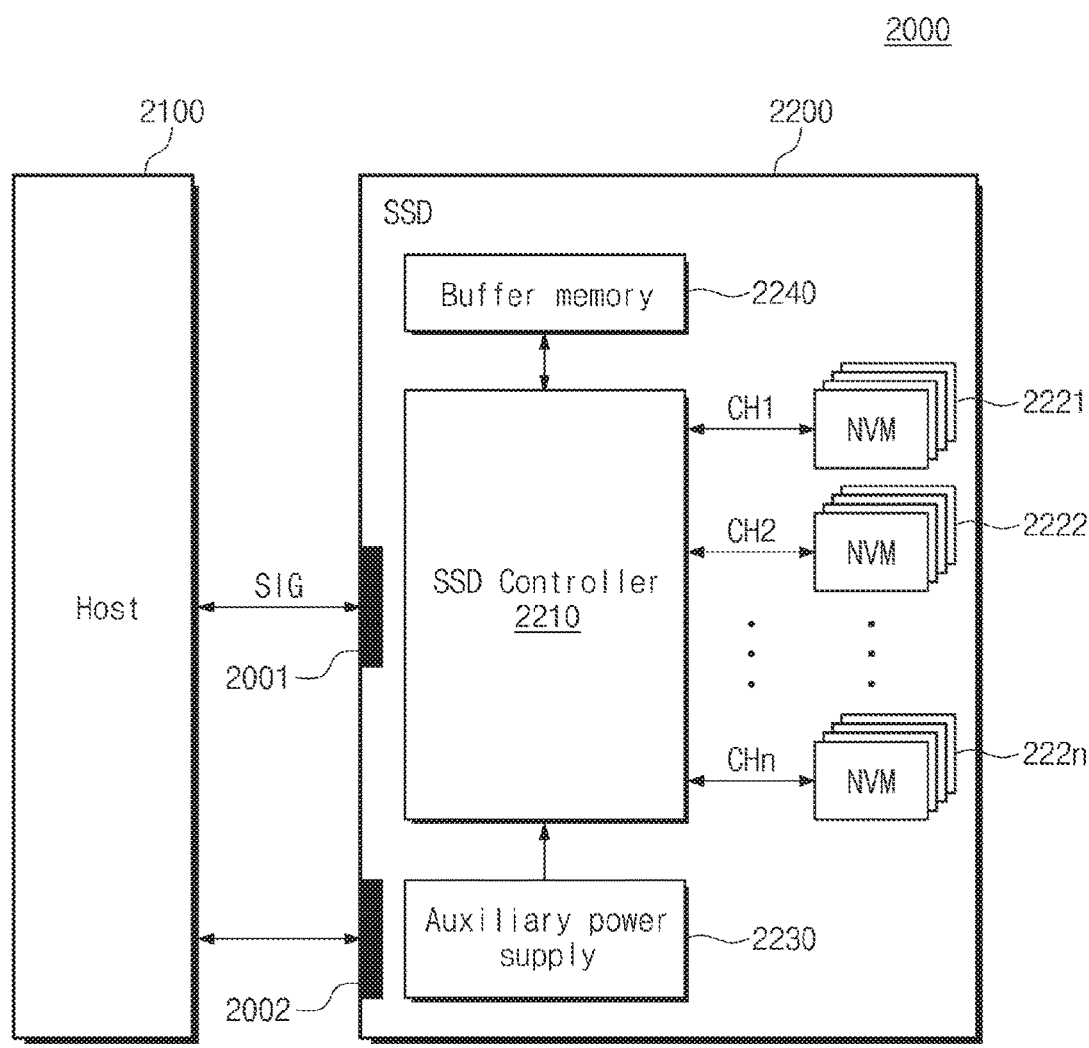
FIG. 13 is a block diagram illustrating a solid state drive including a nonvolatile memory system according to an example embodiment of the inventive concepts.

FIG. 13 is a block diagram illustrating a solid state drive (SSD) system including a nonvolatile memory system according to an example embodiment of the inventive concepts. Referring to FIG. 13, an SSD system 2000 may include a host 2100 and an SSD 2200. The SSD 2200 may exchange signals SIG with the host 2100 through a signal connector 2001 and may be supplied with power from the host 2100 through a power connector 2002. The SSD 2200 may include an SSD controller 2210, a plurality of flash memories 2221 to 222n, an auxiliary power supply 2230, and a buffer memory 2240.

The SSD controller 2210 may control the flash memories 2221 to 222n in response to the signals SIG from the host 2100. In an example embodiment, the SSD controller 2210 may operate based on the method described with reference to FIGS. 1 to 11. The SSD controller 2210 may allow a decrease in an over-provision area of the flash memories 2221 to 222n constituting a plurality of sub-storage devices not to be focused on any one device.

The auxiliary power supply 2230 may be connected with the host 2100 via the power connector 2002. The auxiliary power supply 2230 may be charged by the power from the host 2100. When power is not smoothly supplied from the host 2100, the auxiliary power supply 2230 may power the SSD system 2000. The auxiliary power supply 2230 may be placed inside or outside the SSD 2200. For example, the auxiliary power supply 2230 may be placed in a main board to supply auxiliary power to the SSD 2200.

The buffer memory 2240 may operate as a buffer memory of the SSD 2200. For example, the buffer memory 2240 may temporarily store data received from the host 2100 or from the flash memories 2221 to 222n or may temporarily store metadata (e.g., a mapping table) of the flash memories 2221 to 222n. The buffer memory 2240 may include a volatile memory such as a dynamic RAM (DRAM), a synchronous DRAM (SDRAM), a double date rate (DDR) SDRAM, a low power double data rate (LPDDR) SDRAM, or a static RAM (SRAM) or a nonvolatile memory such as a ferroelectric RAM (FRAM), a resistive RAM (ReRAM), a spin transfer torque-magnetoresistive RAM (STT-MRAM), and a phase change RAM (PRAM).

Figure 14:
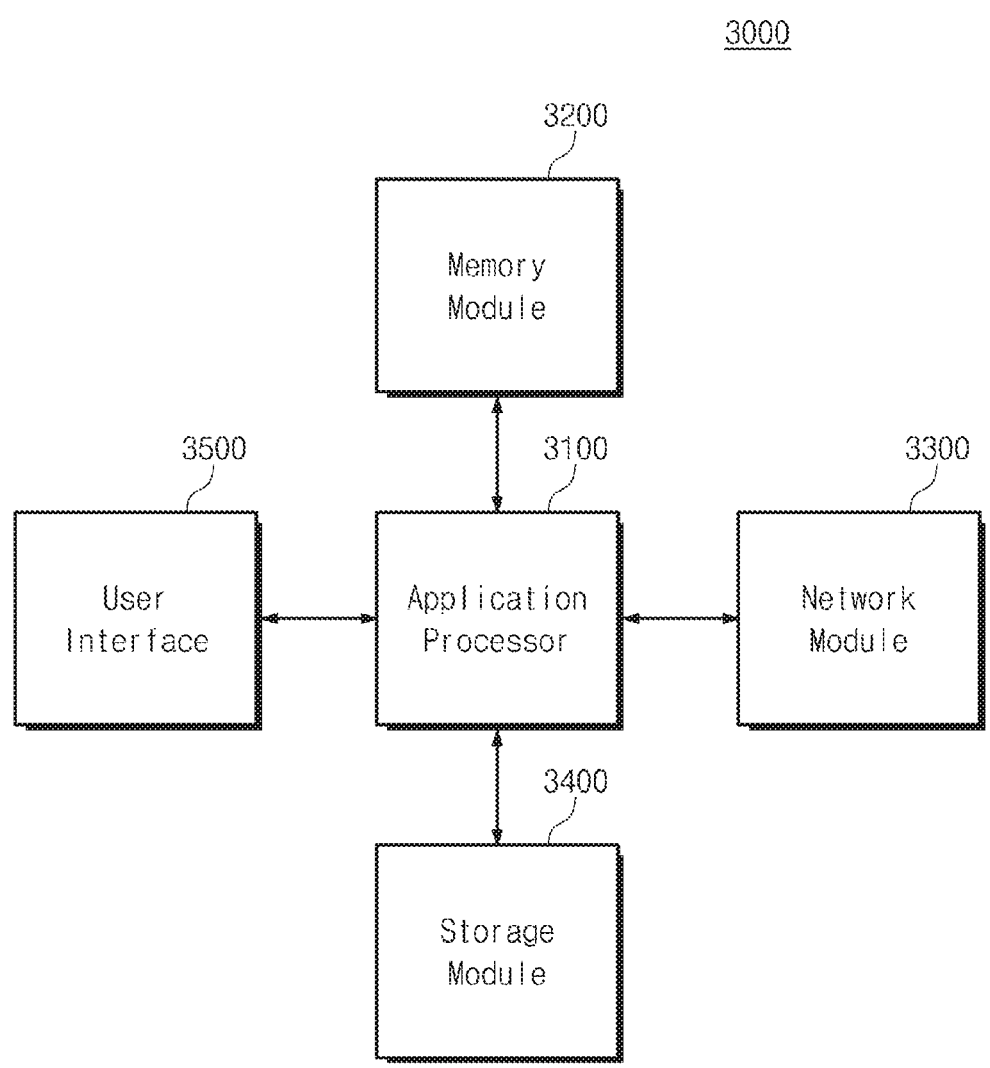
FIG. 14 is a block diagram illustrating a user system using the storage device according to an example embodiment of the inventive concepts.

FIG. 14 is a block diagram illustrating a user system using a storage device according to an example embodiment of the inventive concepts. Referring to FIG. 14, a user system 3000 may include an application processor 3100, a memory module 3200, a network module 3300, a storage module 3400, and a user interface 3500.

The application processor 3100 may drive elements, an operating system, etc. of the user system 3000. In an embodiment, the application processor 3100 may include controllers for controlling elements of the user system 3000, graphics engines, a variety of interfaces, etc. The application processor 3100 may be a system-on-chip (SoC).

The memory module 3200 may operate as a main memory, a working memory, a buffer memory, or a cache memory of the user system 3000. The memory module 3200 may be implemented with a volatile random access memory, such as a DRAM, an SDRAM, a double date rate DRAM (DDR SDRAM), a DDR2 SDRAM, a DDR3 SDRAM, an LPDDR SDRAM, an LPDDR2 SDRAM, or an LPDDR3 SDRAM or a nonvolatile random access memory, such as a PRAM, an MRAM, a RRAM, or a FRAM.

The network module 3300 may communicate with external devices. In an embodiment, the network module 3300 may support wireless communications, such as code division multiple access (CDMA), global system for mobile communication (GSM), wideband CDMA (WCDMA), CDMA-2000, time division multiple access (TDMA), long term evolution (LTE), Wimax, WLAN, UWB, Bluetooth, and WI-DI. In an embodiment, the network module 3300 may be included in the application processor 3100.

The storage module 3400 may store data. For example, the storage module 3400 may store data received from the application processor 3100. For example, the storage module 3400 may provide the application processor 3100 with data stored in the storage module 3400. For example, the storage module 3400 may be implemented with a semiconductor memory device such as a PRAM, an MRAM, a RRAM, a NAND flash memory, a NOR flash memory, or a three-dimensional NAND flash memory. In an example embodiment, the storage module 3400 may operate depending on the manner described with reference to FIGS. 1 to 11.

The user interface 3500 may include interfaces that input data or a command to the application processor 3100 or output data to an external device. For example, the user interface 3500 may include user input interfaces such as a keyboard, a keypad, buttons, a touch panel, a touch screen, a touch pad, a touch ball, a camera, a microphone, a gyroscope sensor, a vibration sensor, and a piezoelectric sensor. The user interface 3500 may further include user output interfaces such as a liquid crystal display (LCD), an organic light-emitting diode (OLED) display device, an active matrix OLED (AMOLED) display device, a light-emitting diode (LED), a speaker, and a motor.

According to an example embodiment of the inventive concepts, it may be possible to markedly reduce a time taken for data training of a nonvolatile memory device. Accordingly, it may be possible to reduce a booting time (or an open time) of a storage device.

While the inventive concepts have been described with reference to some example embodiments, it will be apparent to those skilled in the art that various changes and modifications may be made without departing from the spirit and scope of the inventive concepts. Therefore, it should be understood that the above example embodiments are not limiting, but illustrative.

What is claimed is:

1. A storage device comprising:
    a nonvolatile memory device configured to receive write data based on a data strobe signal and a data signal, and output read data based on the data strobe signal and the data signal; and
    a controller configured to perform a training operation for training the nonvolatile memory device to align the data signal and the data strobe signal, the controller further configured to detect a left edge of a window of the data signal for the training operation, the controller further configured to determine a center of the window by using the left edge and unit interval length information of the data signal or determine a start point of a detection operation for detecting a right edge of the window by using the detected left edge and the unit interval length information.

2. The storage device of claim 1, wherein
    the controller includes a delay locked loop circuit configured to control a delay of the data signal, and
    the controller is further configured to read the unit interval length information from the delay locked loop circuit.

3. The storage device of claim 1, wherein the controller is further configured to execute a read training pattern from the nonvolatile memory device and compare the read training pattern with a reference pattern to detect the left edge.

4. The storage device of claim 3, wherein the controller is configured to determine that the left edge in response to the read training pattern and the reference pattern coinciding with each other in the detection operation.

5. The storage device of claim 3, wherein the controller is configured to skip the detection operation for detecting the right edge from the left edge to the start point in response to the left edge being detected in the detection operation.

6. The storage device of claim 3, wherein the controller is configured to calculate the center of the window by adding one half of a unit interval length, which is included in the unit interval length information, to the left edge.

7. The storage device of claim 1, wherein the left edge and the right edge are aligned to rising edges of the data strobe signal, respectively.

8. A data training method for a storage device including a controller and a nonvolatile memory device, the method comprising:
    performing, by the controller, at least one first edge detection operation to detect a left edge of a window of a data signal;
    determining, by the controller, a skip interval based on a length of a unit interval of the data signal provided from a delay locked loop circuit of the storage controller;
    performing, by the controller, at least one second edge detection operation to detect a right edge of the window, at a point shifted from the left edge by a length of the skip interval; and
    determining, by the controller, a center of the window by using temporal information of the detected left and right edges to align the data signal.

9. The method of claim 8, wherein each of the first edge detection operation and the second edge detection operation includes:
    reading a training pattern from the nonvolatile memory device; and
    comparing the read training pattern with a reference pattern.

10. The method of claim 9, wherein the comparing includes determining detection of the left edge or the right edge in response to the read training pattern and the reference pattern coinciding with each other.

11. The method of claim 8, wherein the length of the skip interval is equal to or shorter than the length of the unit interval.

12. The method of claim 8, wherein the length of the unit interval corresponds to a length of a delay chain applied to the data signal.

13. The method of claim 8, wherein the length of the unit interval, the length of the skip interval, the left edge, and the right edge are temporal information.

14. The method of claim 8, further comprising:
    determining a start point for the performing at least one first edge detection operation.

15. The method of claim 8, further comprising:
    aligning a sampling time or a transmission time of the data signal to the determined center of the window.

16. A data training method for a storage device including a controller and a nonvolatile memory device, the method comprising:
    performing, by the controller, a detection operation at least once to detect a left edge of a window of a data signal;
    reading, by the controller, a unit interval length of the data signal from a delay locked loop circuit of the controller; and
    combining, by the controller, a location of the detected left edge and the unit interval length to determine a center of the window of the data signal and align the data signal thereto.

17. The method of claim 16, wherein the detection operation includes:
    reading a training pattern from the nonvolatile memory device; and
    comparing the read training pattern with a reference pattern.

18. The method of claim 17, wherein the comparing includes determining that the data signal is aligned to the left edge in response to the read training pattern and the reference pattern coinciding with each other.

19. The method of claim 16, wherein the combining includes determining the center of the window of the data signal by adding one half of the unit interval length to a location of the left edge.

20. The method of claim 16, further comprising:
setting a sampling time or a transmission time of the data signal to the center of the window of the data signal.

* * * * *